US011936377B2

(12) United States Patent
Murai et al.

(10) Patent No.: US 11,936,377 B2
(45) Date of Patent: Mar. 19, 2024

(54) IMPEDANCE CONTROL FOR INPUT/OUTPUT CIRCUITS

(71) Applicant: MICRON TECHNOLOGY, INC., Boise, ID (US)

(72) Inventors: Shuichi Murai, Ibaraki (JP); Nobuki Takahashi, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 17/741,299

(22) Filed: May 10, 2022

(65) Prior Publication Data
US 2023/0370065 A1   Nov. 16, 2023

(51) Int. Cl.
*H03K 19/00* (2006.01)
*G11C 7/10* (2006.01)

(52) U.S. Cl.
CPC ....... *H03K 19/0005* (2013.01); *G11C 7/1057* (2013.01); *G11C 7/1063* (2013.01); *G11C 7/1084* (2013.01); *G11C 7/109* (2013.01)

(58) Field of Classification Search
None
See application file for complete search history.

(56) References Cited

U.S. PATENT DOCUMENTS

| 2017/0054442 | A1* | 2/2017 | Kim | H03K 19/0005 |
| 2019/0028102 | A1* | 1/2019 | Gans | G11C 11/4094 |
| 2019/0259429 | A1* | 8/2019 | Heo | G11C 7/14 |

* cited by examiner

*Primary Examiner* — Anh Q Tran
(74) *Attorney, Agent, or Firm* — Dorsey & Whitney LLP

(57) ABSTRACT

Apparatuses including an impedance code selector are disclosed. An example apparatus according to the disclosure includes an impedance calibration circuit, an impedance code selector and a driver circuit in a data input/output circuit. The impedance calibration circuit provides a first impedance code. The impedance code selector provides either the first impedance code or a second impedance code. The driver circuit receives either the first impedance code or the second impedance code from the impedance code selector.

18 Claims, 9 Drawing Sheets

US 11,936,377 B2

IMPEDANCE CONTROL FOR INPUT/OUTPUT CIRCUITS

BACKGROUND

High data reliability, high speed of memory access, reduced chip size and reduced power consumption are features that are demanded from semiconductor memory.

Multiple devices in a peripheral region of semiconductor memory may need different power supply voltages. To reduce internal power consumption, a multiple peripheral power supply voltage system may be used. In such a system, a higher peripheral power supply voltage may be provided to devices configured to consume the higher voltage and/or power consuming operations, and a lower peripheral power supply voltage may be provided to devices configured to consume the lower voltage and/or less power consuming operations. Recent semiconductor memory may internally change power supply voltages responsive to a control command, for example.

In conventional peripheral circuits for a semiconductor device, for example, a data input/output circuit, a command/address input circuit and a clock input circuit are provided with a common impedance code to adjust impedances around the input/output terminals. However, the common impedance code may not be suitable to adjust impedances of drivers which may be receiving signal from or providing signals to internal devices which are operated with different peripheral power supply voltages. For example, data input/output drivers may be affected by such power supply changes. To adjust impedance around the input/output circuits while reducing power consumption, more effective and efficient impedance control may be desired.

DETAILED DESCRIPTION

Various embodiments of the disclosure will be explained below in detail with reference to the accompanying drawings. The following detailed description refers to the accompanying drawings that show, by way of illustration, specific aspects and details in which embodiments of the disclosure may be practiced. The detailed description includes sufficient detail to enable those skilled in the art to practice embodiments of the disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

To adjust impedance of input/output circuits coupled to input/output terminals according to different peripheral voltages, different impedance code (ZQ code) may be provided to input/output circuits. In some embodiments, pull-up and pull-down drivers of a data input/output circuit may be selectively provided with either an impedance code based on impedance (ZQ) calibration or provided with another impedance code not based on the ZQ calibration during a low power supply mode according to different peripheral power supply voltages. In some embodiments, pull-up and pull-down drivers of a data input/output circuit and on-die termination drivers of a command/address input circuit and a clock input circuit may be provided with different impedance codes based on impedance (ZQ) calibration according to different peripheral power supply voltages.

Figure 1:
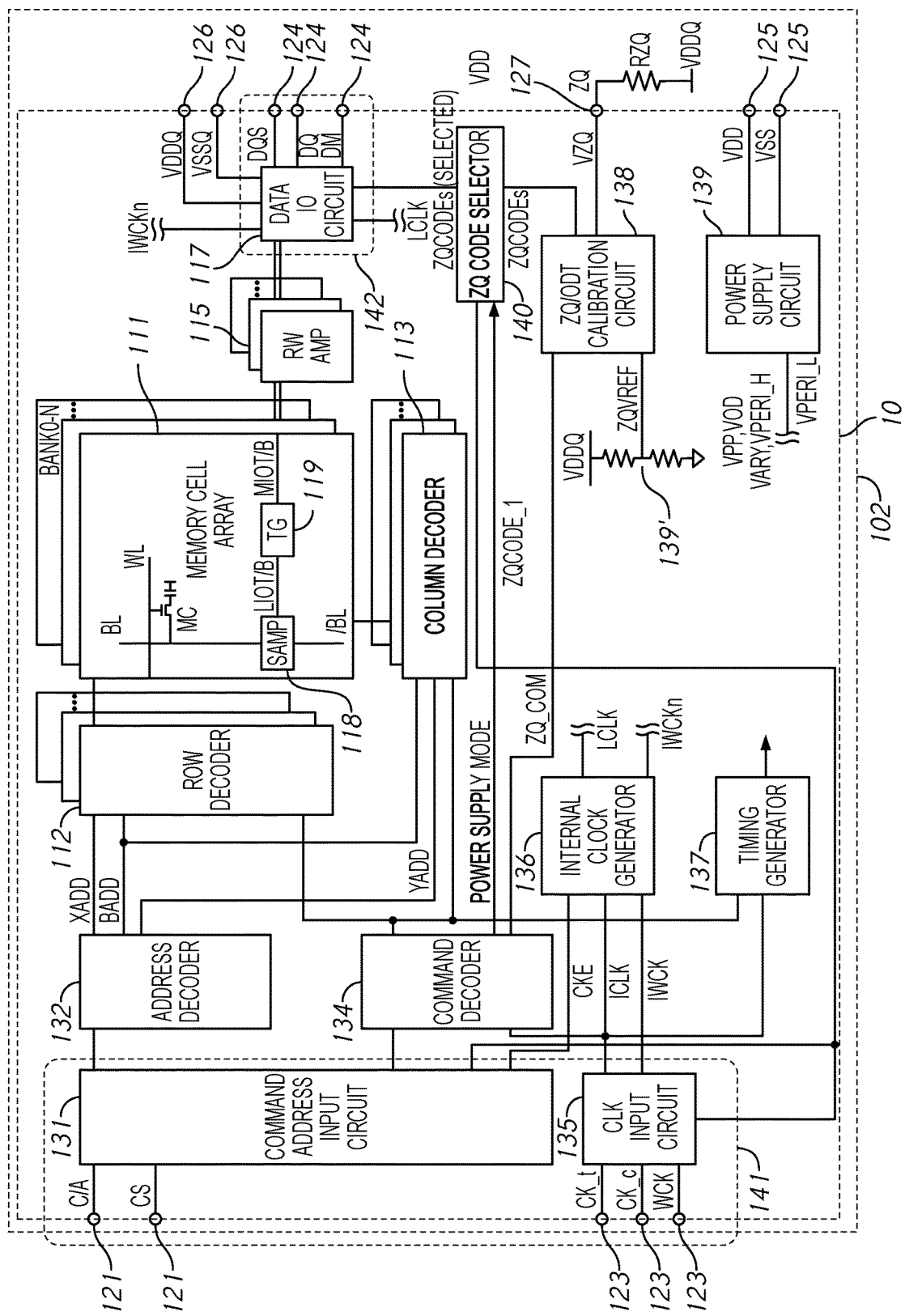
FIG. 1 is a block diagram of a semiconductor device in accordance with an embodiment of the present disclosure.

FIG. 1 is a block diagram of a semiconductor device 10 in accordance with one embodiment of the present disclosure. The semiconductor device 10 may be a dynamic random-access memory (DRAM), such as a double data rate SDRAM integrated into a single semiconductor chip, for example. The semiconductor device 10 may be mounted on an external substrate 102, for example, a memory module substrate, a mother board or the like. The external substrate 102 may include an external resistor $R_{ZQ}$ that is connected to a calibration terminal ZQ 127 of the semiconductor device 10. The external resistor $R_{ZQ}$ is a reference impedance of a ZQ calibration circuit 138. In the present embodiment, the external resistor $R_{ZQ}$ is coupled to a positive potential VDDQ. In other embodiments, however, the external resistor $R_{ZQ}$ may be coupled to a different potential.

As shown in FIG. 1, the semiconductor device 10 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 118 are coupled to corresponding bit lines BL and connected to local I/O line pairs LIOT/B. Local IO line pairs LIOT/B are connected to main IO line pairs MIOT/B via transfer gates TG which function as selector circuits.

Turning to the explanation of a plurality of external terminals included in the semiconductor device 10, the plurality of external terminals includes command/address terminals 121, clock terminals 123, data terminals 124, power supply terminals 125 and 126, and the calibration terminal ZQ 127. An input signal block 141 may include the command/address terminals 121. The command/address terminals 121 and signal lines coupled to the command/address terminal 121 may include a first set of terminals and signal lines that are configured to receive the command signals and a separate, second set of terminals and signal lines that configured to receive the address signals, in some examples. In other examples, the terminals 121 and signal lines associated with command/address terminals 121 the may include common terminals and signal lines that are configured to receive both command signal and address signals. The input signal block 141 may include the clock terminals 123 which include input buffers. A data interface block 142 includes the data terminals 124 that will be later described, according to one embodiment. The data terminals 124 may be coupled to output buffers for read operations of memories. Alternatively, the data terminals 124 may be coupled to input buffers for read/write access of the memories. FIG. 1 shows an example of dynamic random access memory (DRAM), however, any device having external terminals for signal input/output may be included as the external terminals of embodiments of the present disclosure. Each terminal of the plurality of external terminals may include a pad. A plurality of pads in the plurality of external terminals 124 will be explained below in detail.

The semiconductor device 10 includes a command/address input circuit 131. The command/address input circuit 131 may receive a chip select signal CS, an address signal ADD and a bank address signal BADD from the command/address terminals 121, and transmit the address signal ADD and the bank address signal BADD to an address decoder 132. The address decoder 132 may decode the address signal ADD and provide a decoded row address signal XADD to the row decoder 112, and a decoded column address signal YADD to the column decoder 113. The address decoder 132 also may also receive the bank address signal BADD and provide the bank address signal BADD to the row decoder 112 and the column decoder 113.

The command/address input circuit 131 may receive a command signal from outside, such as, for example, a memory controller, at the command/address terminals 121. The command/address input circuit 131 may provide the command signal to the command decoder 134. The command decoder 134 may decode the command signal and generate various internal command signals. The internal command signals may be used to control operation and timing of various circuits of the semiconductor device 10. For example, the internal command signals may include a row command signal, such as an active command, to select a word line and a column command signal, such as a read command or a write command, to select a bit line, and a calibration signal ZQ_COM provided to the ZQ calibration circuit 138.

Accordingly, when an active command is issued with a row address and a column address is timely supplied with a read command, read data is read from a memory cell MC in the memory cell array 111 designated by these row address and column address. The read data DQ is output externally from the data terminals 124 via a read/write amplifier 115 and a data input/output circuit 117. Similarly, when the write command is issued and a column address is timely supplied with this command, and then write data DQ is supplied to the data terminals 124, the write data DQ is supplied via the data input/output circuit 117 and the read/write amplifier 115 to the memory cell array 1 and written in the memory cell MC designated by the row address and the column address.

The clock terminals 123 are supplied with external clock signals CK_t and CK_c for operating internal circuits, and a write clock signal WCK for writing data respectively. These external clock signals CK_t and CK_c are complementary to each other and are supplied to a clock input circuit 135. The clock input circuit 135 receives the external clock signals CK_t and CK_c and generates an internal clock signal ICLK. The internal clock signal ICLK is supplied to an internal clock generator 136 and thus a phase controlled internal clock signal LCLK is generated based on the received internal clock signal ICLK and a clock enable signal CKE from the command/address input circuit 131. The phase controlled internal clock signal LCLK is supplied to the data input/output circuit 117 and is used as a timing signal for determining an output timing of the read data DQ. The internal clock signal ICLK is also supplied to a timing generator 137 and thus various internal clock signals can be generated.

When a write command and associated address are provided to the semiconductor device 10, the command/address input circuit 131 receives the write command and associated chip to be selected and addresses, and performs a write operation to write data to a memory location corresponding to the addresses. In preparation of receiving the write data, the clock input circuit 135 may receive active (e.g., toggling) write clock signal WCK and provide internal write clock signal IWCK. After the data clock signals are activated, the write data may be provided. The internal clock generator 136 may use the IWCK signal to generate internal clock signals IWCKn for timing the operation of circuits to receive the write data. The data input/output circuit 142 receives the write data, which is written to memory corresponding to the memory addresses using the internal clock signals IWCKn.

The power supply terminals 125 are supplied with power supply potentials VDD and VSS. These power supply potentials VDD and VSS are supplied to an internal power supply circuit 139. The internal power supply circuit 139 generates various internal potentials, for example, VPP, VOD, VARY, VPERI_H, VPERI_L based on the power supply potentials VDD and VSS. The internal potential VPP is mainly used in the row decoder 112, the internal potentials VOD and VARY are mainly used in the sense amplifiers 118 included in the memory cell array 111, and the internal potentials VPERI_H and VPERI_L may be used in many other circuit blocks in a peripheral region outside the memory cell array 111.

The power supply terminals 126 are supplied with power supply potentials VDDQ and VSSQ. These power supply potentials VDDQ and VSSQ are supplied to the data input/output circuit 117. The power supply potentials VDDQ and VSSQ may be used for the data input/output circuit 117 so that power supply noise generated by the data input/output circuit 117 does not propagate to the other circuit blocks.

The calibration terminal ZQ 127 is connected to the calibration circuit 138. The ZQ calibration circuit 138 performs a calibration operation with reference to an impedance of the external resistance $R_{ZQ}$ and a reference potential ZQVREF provided by a ZQ power supply circuit 139'. In some embodiments, the reference potential ZQVREF is based on the power supply potential VDDQ. When the calibration circuit 138 is activated by the calibration signal ZQ_COM, an impedance code ZQCODE_1 may be provided by the calibration operation. A ZQ code selector 140 may receive the impedance code ZQCODE_1. The ZQ code selector 140 may also store other impedance codes (e.g., ZQCODEs). The ZQ code selector 140 may provide the impedance code ZQCODE_1 to the clock input circuit 135 and the command/address input circuit 131. The ZQ code selector 140 may provide impedance codes to the data input/output circuit 117, depending on the power supply mode. Thus impedances of input buffers and output buffers in the data input/output circuit 117 can be adjusted based on the power supply mode.

Figure 2:
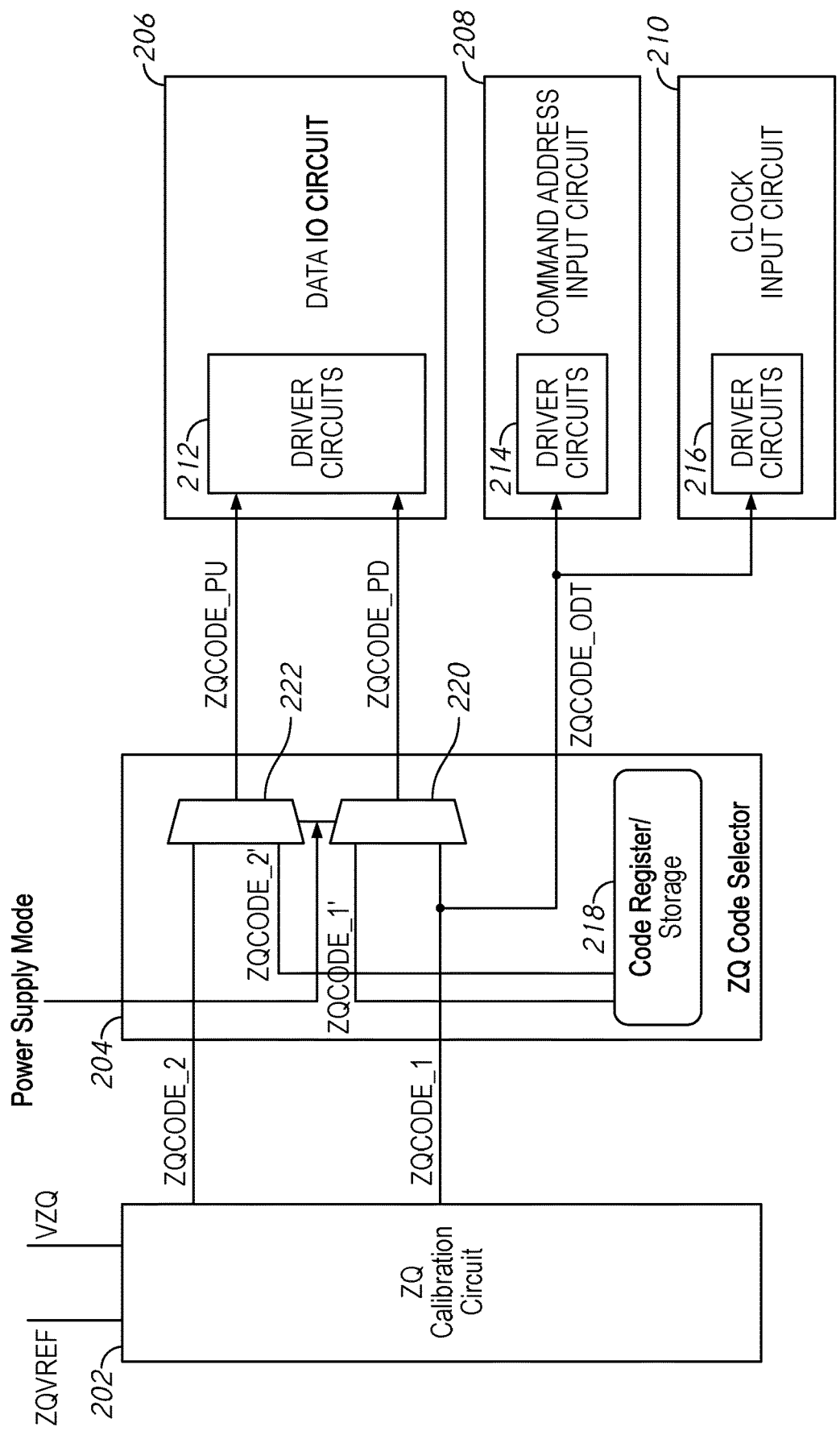
FIG. 2 is a schematic diagram of a ZQ calibration circuit, a ZQ code selector, a data input/output circuit, a command/address input circuit and a clock input circuit, in accordance with an embodiment of the present disclosure.

FIG. 2 is a schematic diagram of an impedance (ZQ) calibration circuit 202, a impedance (ZQ) code selector 204, a data input/output circuit 206, a command/address input circuit 208 and a clock input circuit 210, in accordance with an embodiment of the present disclosure. The ZQ calibration circuit 202 may be used to implement the ZQ calibration circuit 138 in some examples. The ZQ code selector 204 may be used to implement the ZQ code selector 140 in some examples. In some examples, the data input/output circuit 206 may implement the data input/output circuit 117. In some examples, the command/address input circuit 208 may implement the command/address input circuit 131. In some examples, the clock input circuit 210 may implement the clock input/output circuit 135.

The ZQ calibration circuit 202 may receive a ZQ pad voltage VZQ, for example, on a calibration terminal ZQ 127. The ZQ calibration circuit 202 may compare the ZQ pad voltage VZQ with a reference potential ZQVREF provided by a power supply circuit, such as a ZQ power supply circuit 139'. Based on ZQ pad voltage VZQ and the reference potential ZQVREF, the ZQ calibration circuit 202 provides an impedance code signal ZQCODE_1 to set a pull-down impedance. The ZQ calibration circuit 202 also provides the impedance code signal as an impedance code signal for an on-die termination ZQCODE_ODT for driver circuits 214 and 216. The ZQ calibration circuit 202 further provides an impedance code signal ZQCODE_2 to set a pull-up impedance. In some embodiments, the impedance code signals ZQCODE_1 and ZQCODE_2 may include bits determined and updated during a calibration operation. The ZQ calibration circuit 202 may provide the impedance code signals ZQCODE_1 and ZQCODE_2 to the ZQ code selector 204.

The ZQ code selector 204 may receive the impedance code signals ZQCODE_1 and ZQCODE_2 from the ZQ calibration circuit 202. The ZQ code selector 204 may include a storage 218 and selector circuits 220 and 222. In some embodiments, the storage 218 may be a code register that stores an impedance code signal ZQCODE_1' for a pull-down impedance and an impedance code signal ZQCODE_2' for a pull-up impedance. In some embodiments, the impedance code signals ZQCODE_1' and ZQCODE_2' may be fixed. In some embodiments, the fixed impedance code signals ZQCODE_1' and ZQCODE_2' may include predetermined bits. In some embodiments, the ZQCODE_1' and ZQCODE_2' may be controlled by a fuse program or a similar configuration. In some embodiments, the impedance code signals ZQCODE_1' and ZQCODE_2' may include bits determined during an initialization operation.

The selector circuits 220 and 222 selectively provide output signals responsive to a power supply mode signal. The power supply mode signal is indicative of either a high power supply mode or a low power supply mode. If the power supply mode is the high power supply mode, a relatively high power supply voltage VPERI_H may be supplied to peripheral circuits outside the memory cell array 111 in the semiconductor device 10. If the power supply mode is the low power supply mode, a relatively low power supply voltage VPERI_L may be supplied to the peripheral circuits outside the memory cell array 111 in the semiconductor device 10.

The selector circuit 220 may selectively provide either an impedance code signal ZQCODE_1 from the ZQ calibration circuit 202 or an impedance code signal ZQCODE_1' from the storage 218 responsive to the power supply mode signal as an impedance code signal ZQCODE_PD to set a pull-down impedance. The selector circuit 222 may selectively provide either an impedance code signal ZQCODE_2 from the ZQ calibration circuit 202 or an impedance code signal ZQCODE_2' from the storage 218 responsive to the power supply mode signal as an impedance code signal ZQCODE_PU to set a pull-up impedance. The selected impedance code signals are provided to the driver circuits 212.

Figure 3B:
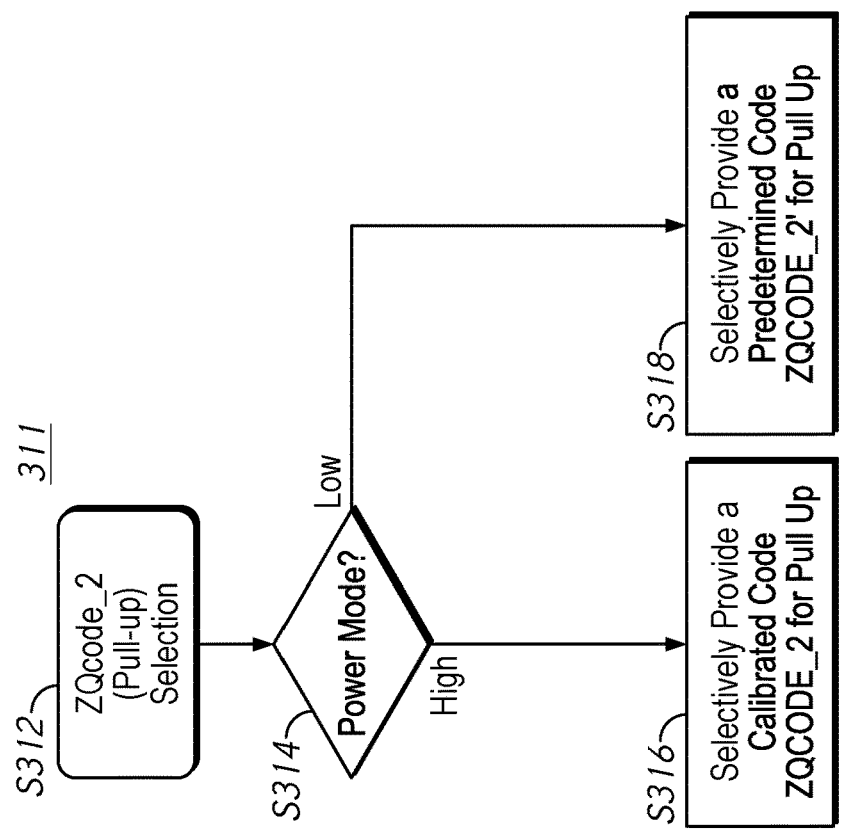
FIGS. 3A and 3B are flow diagrams for selecting and providing impedance code (ZQ code) in accordance with an embodiment of the present disclosure.
Figure 3A:
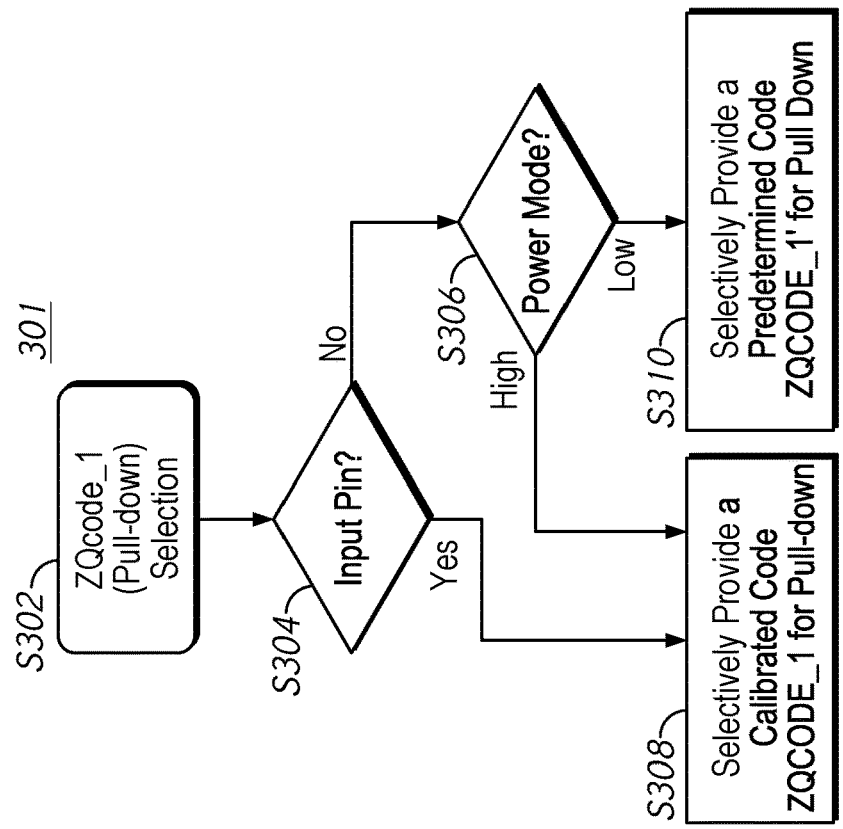

FIGS. 3A and 3B are flow diagrams for selecting and providing impedance code (ZQ code) in accordance with an embodiment of the present disclosure. Operations of the selector circuits 220 and 222 will be described as procedure 301 in FIG. 3A and procedure 311 in FIG. 3B, respectively. In step S302, the procedure for selecting an impedance code for pull-down impedance and/or on-die termination operation begins. In step S304, if signals for impedance control are input signal to be provided to driver circuits 214 and 216 in the command/address input circuit 208 and the clock input circuit 210, the calibrated impedance code signal ZQCODE_1 may be provided directly to the driver circuits 214 and 216 in the command/address input circuit 208 and the clock input circuit 210 without passing through the selector circuit 220.

The selector circuit 220 receives the impedance code signal ZQCODE_1 from the ZQ calibration circuit 202 and the impedance code signal ZQCODE_1' from the storage 218 for a pull-down operation. The selector circuit 220 may also receive the power supply mode signal which is indicative of either the high power supply mode or the low power supply mode. In step S306, if the power supply mode is the high power supply mode, the selector circuit 220 may selectively provide the impendence code signal ZQCODE_1 to the driver circuits 212 in step S308. In step S306, if the power supply mode is the low power supply mode, the selector circuit 220 may selectively provide the impendence code signal ZQCODE_1' in step S310.

With reference to FIG. 3B, in step S312, the procedure for selecting an impedance code for pull-up impedance begins. The selector circuit 222 receives the impedance code signal ZQCODE_2 from the ZQ calibration circuit 202 and the impedance code signal ZQCODE_2' from the storage 218 for a pull-up operation. The selector circuit 222 may also receive the power supply mode signal. In step S314, if the power supply mode is the high power supply mode, the selector circuit 222 may selectively provide the impendence code signal ZQCODE_2 to the driver circuits 212 in step S316. In step S314, if the power supply mode is the low power supply mode, the selector circuit 222 may selectively provide the impendence code signal ZQCODE_2' in step S318.

Figure 4:
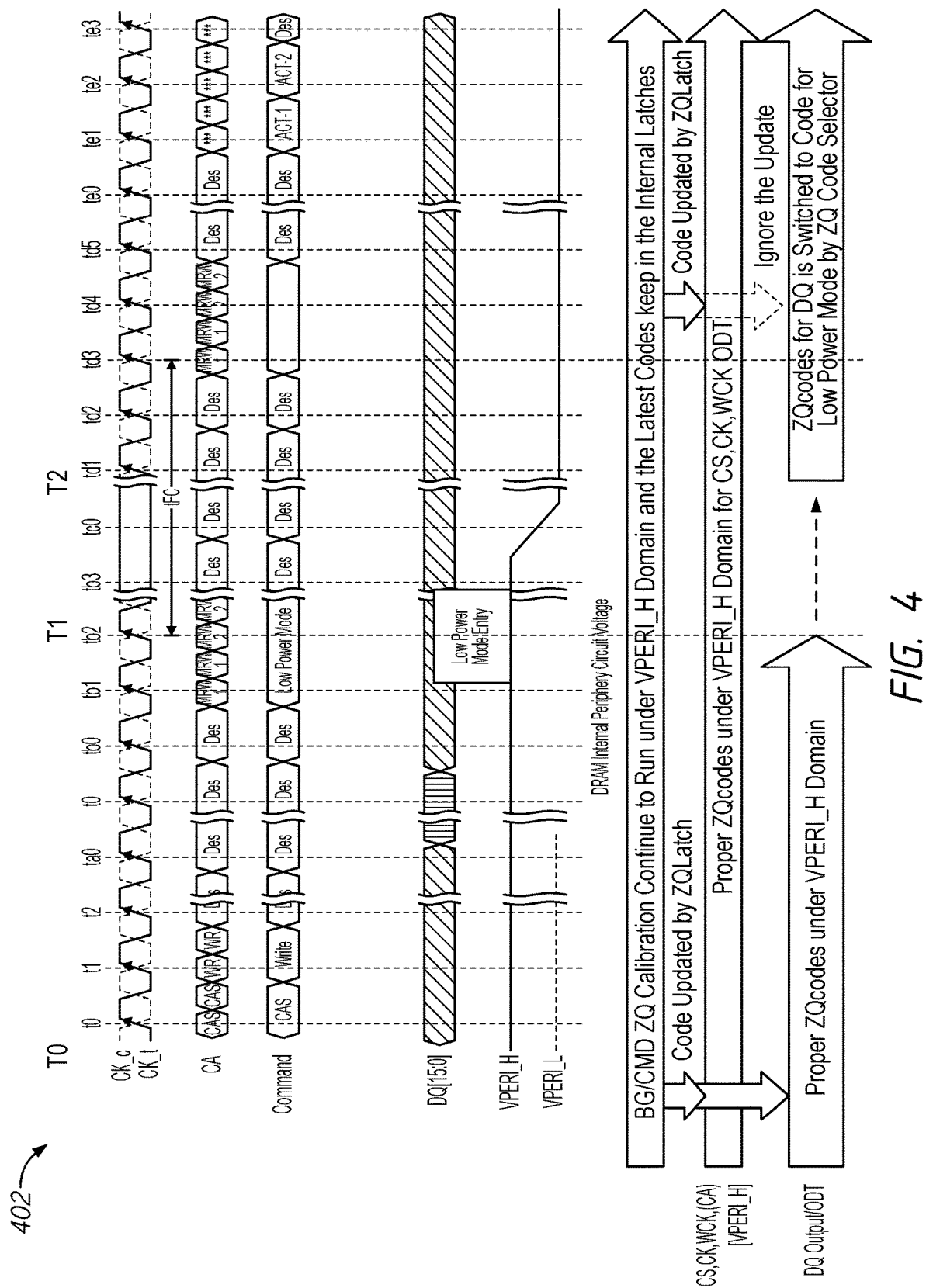
FIG. 4 is a timing diagram of a plurality of signals during impedance code (ZQ code) selection in accordance with an embodiment of the present disclosure.

FIG. 4 is a timing diagram 402 of a plurality of signals during selecting and providing impedance code (ZQ code) in accordance with an embodiment of the present disclosure. The ZQ code selector 204 may provide the calibrated impedance code signal ZQCODE_1 to the driver circuits 214 and 216 before and after the ZQ code selection.

In an example operation of FIG. 4, the power supply mode signal may be indicative of the high power supply mode prior to time T0. A low power supply mode is entered from time T0 to time T1. A high power supply mode operation may be performed, for example, by the semiconductor device 10. During the high power supply operation, the selector circuits 220 and 222 may provide the driver circuits 212 with the calibrated impedance code signals ZQCODE_1 and ZQCODE_2 respectively.

Command/address terminals, such as the command/address terminals 121, may receive a command instructing an entry to a low power supply mode at time T1. For example, the command may be a mode register write (MRW) command that instructs the semiconductor device 10 to enter a low power supply mode. In some examples, the command decoder 134 may provide the power supply mode signal indicative of the low power supply mode responsive to the entry command at time T1. Responsive to the power supply mode signal indicative of the low power supply mode from time T1, the selector circuits 220 and 222 of the ZQ code selector 204 may provide the driver circuits 212 with the impedance code signals ZQCODE_1' and ZQCODE_2' respectively, regardless of periodical updates of the calibrated impedance codes ZQCODE_1 and ZQCODE_2. In some embodiments, the transition between time T1 and time T2, namely from providing the calibrated impedance code signals ZQCODE_1 and ZQCODE_2 to providing the impedance code signals ZQCODE_1' and ZQCODE_2' may be within a frequency change time tFC.

Figure 5:
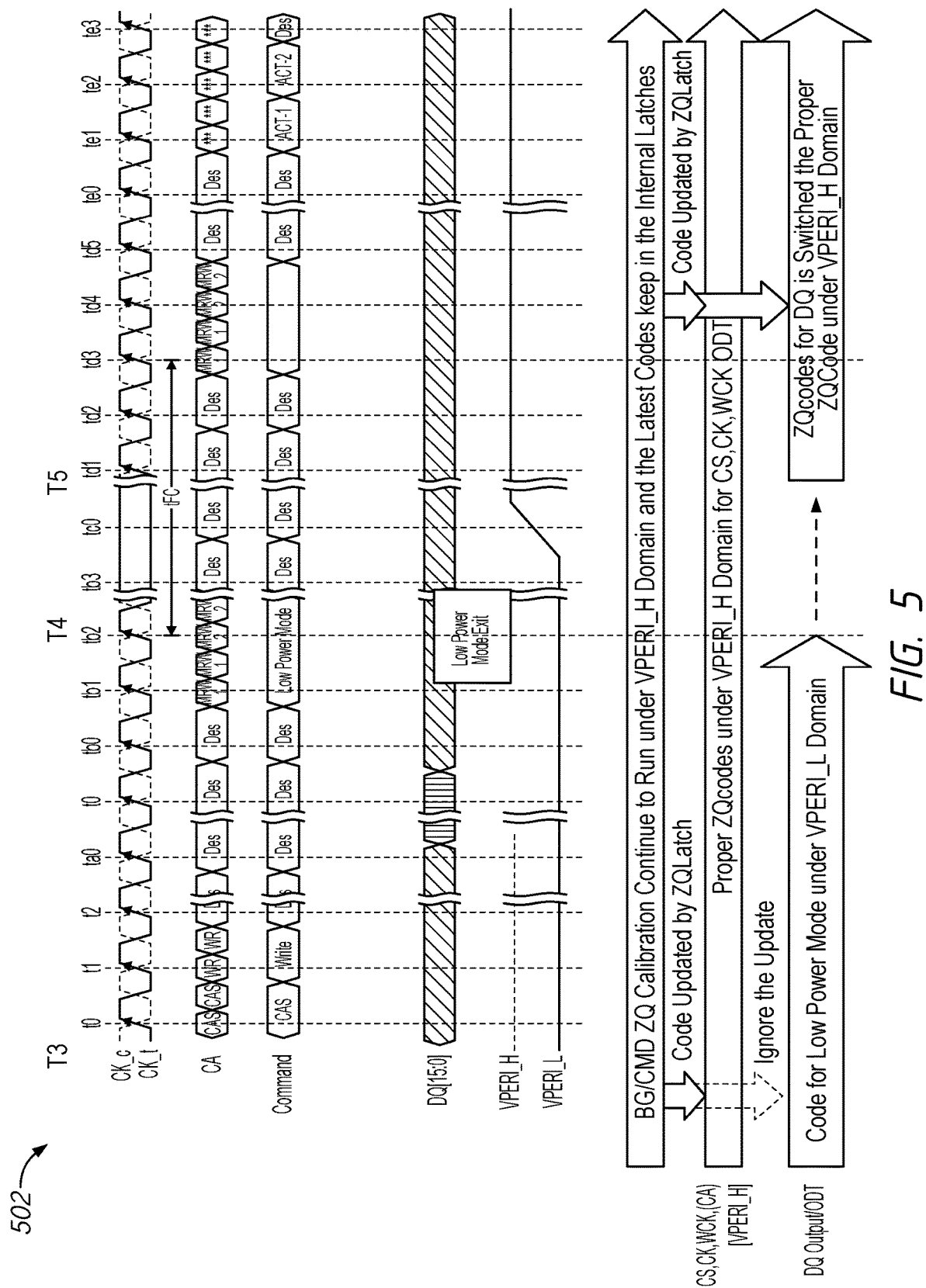
FIG. 5 is a timing diagram of a plurality of signals during impedance code (ZQ code) selection in accordance with an embodiment of the present disclosure.

FIG. 5 is a timing diagram 502 of a plurality of signals during selecting and providing impedance code (ZQ code) in accordance with an embodiment of the present disclosure. The ZQ code selector 204 may provide the calibrated impedance code signal ZQCODE_1 to the driver circuits 214 and 216 before and after the ZQ code selection.

In some embodiments, the power supply mode signal may be indicative of the low power supply mode prior to time T3. The low power supply mode is exited from time T3 to time T4. A low power supply mode operation may be performed by the semiconductor device 10. During the low power supply voltage operation, as described with reference to FIG. 4, the selector circuits 220 and 222 of the ZQ code selector 204 may provide the driver circuits 212 with the impedance code signals ZQCODE_1' and ZQCODE_2' regardless of periodical updates of the calibrated impedance code signals ZQCODE_1 and ZQCODE_2.

The command/address terminals may receive a command instructing an exit from the low power supply mode at time T4. For example, the command may be a mode register write (MRW) command that instructs the semiconductor device 10 to enter a high power supply mode. In some examples, the command decoder 134 may provide the power supply mode signal indicative of the high power supply mode responsive to the entry command at time T4. Responsive to the power supply mode signal indicative of the high power supply mode from time T4, the selector circuits 220 and 222 of the ZQ code selector 204 may provide the driver circuits 212 with the calibrated impedance code signals ZQCODE_1 and ZQCODE_2 respectively, which are updated periodically by the ZQ calibration circuit 202. In some embodiments, the transition between time T4 and time T5, namely from providing the impedance code signals ZQCODE_1' and ZQCODE_2' to providing the calibrated impedance code signals ZQCODE_1 and ZQCODE_2 may be within a frequency change time tFC.

Figure 6:
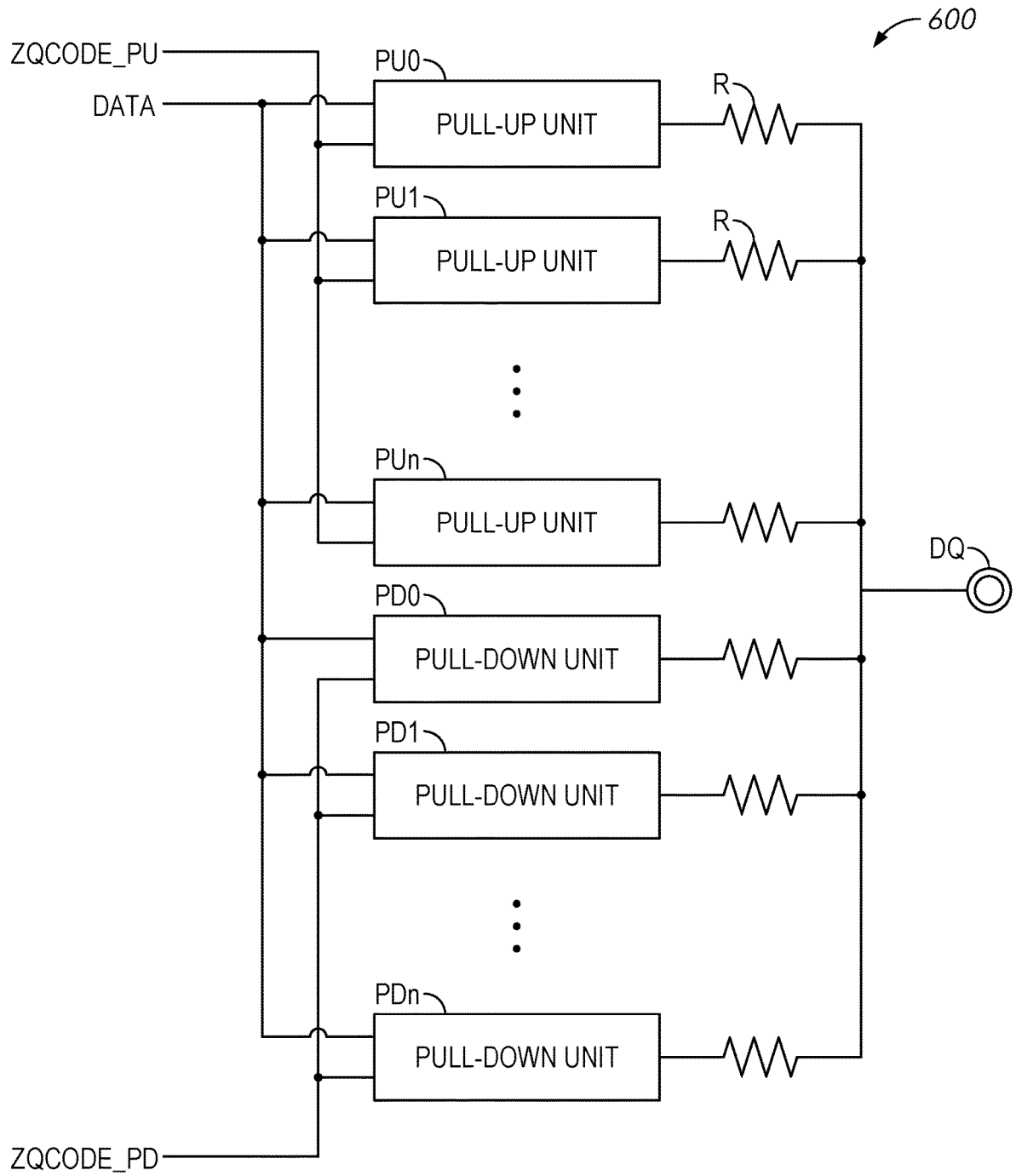
FIG. 6 is a schematic diagram of driver circuits in accordance with an embodiment of the present disclosure.

The driver circuits 212 may include one or more pairs of pull-up units and pull-down units for each data input/output terminal. The driver circuits 214 and 216 may include one or more pull-down units. FIG. 6 is a schematic diagram of driver circuits 600 in accordance with the present disclosure. The driver circuits 600 may be the driver circuits 212. The driver circuits 600 may include (n+1) pull-up unit circuits PU0 to PUn and (n+1) pull-down unit circuits PD0 to PDn for a corresponding data terminal (or data bit) DQ, such as one of the data terminals 124. Each of the pull-up unit circuits PU0 to PU6 may have the same circuit configuration, which includes pull-up transistors. Similarly, each of the pull-down unit circuits PD0 to PD6 may have the same circuit configuration, which includes pull-down transistors. The output nodes of the pull-up unit circuits PU0 to PU6 and pull-down unit circuits PD0 to PD6 may be coupled to the data terminal (or data bit) DQ via resistors R. The pull-up circuits PU0 to PUn are provided pull-up impedance code signals (shown in FIG. 6 as ZQCODE_PU signals), for example, by a ZQ code selector, to set an impedance of the pull-up circuits. Similarly, the pull-down circuits PD0 to PDn are provided pull-down impedance code signals (shown in FIG. 6 as ZQCODE_PD signals), for example, by a ZQ code selector, to set an impedance of the pull-down circuits.

Figure 7:
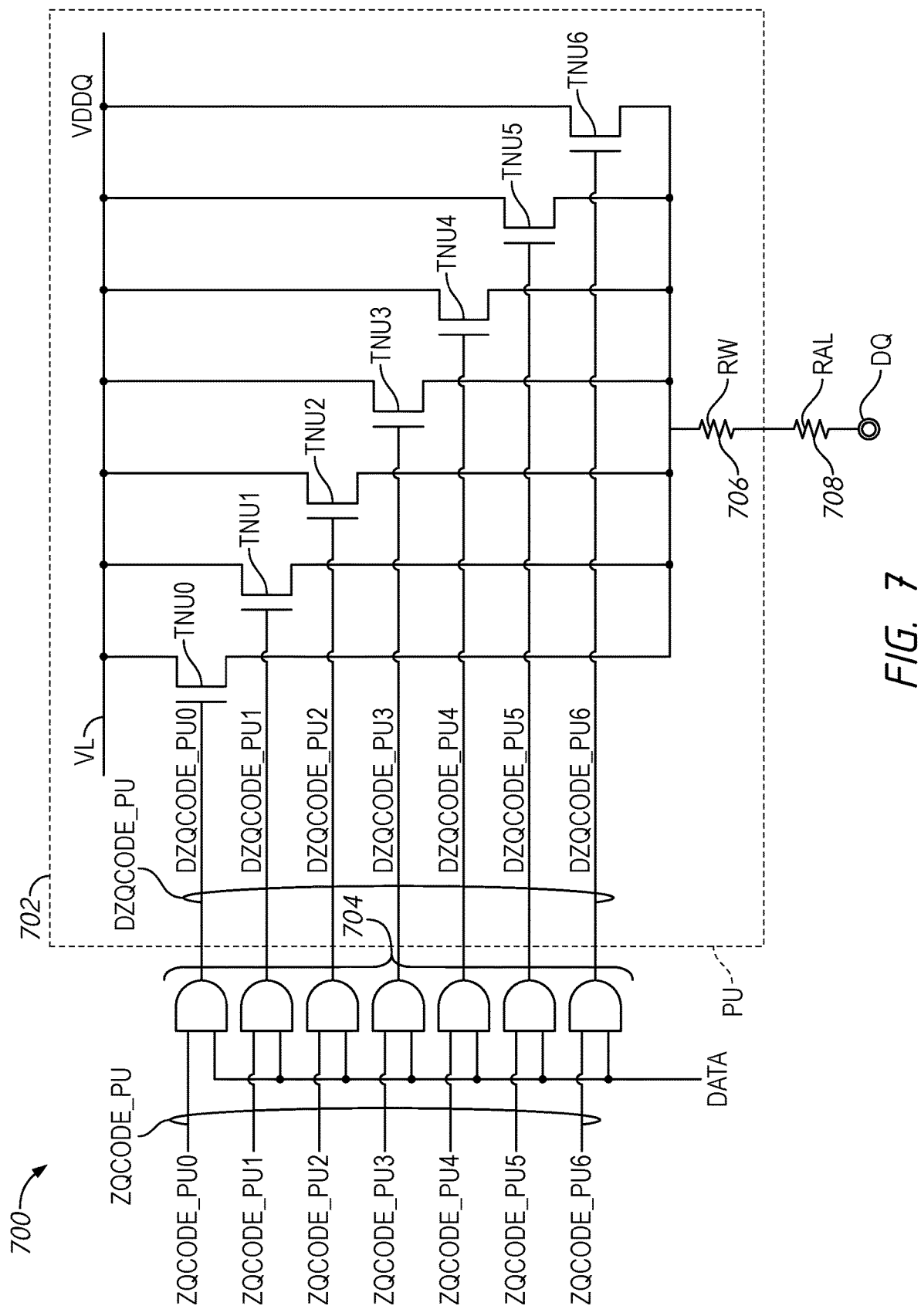
FIG. 7 is a schematic diagram of a pull-up unit circuit in accordance with an embodiment of the present disclosure.

FIG. 7 is a schematic diagram of a pull-up unit circuit 700 in accordance with the present disclosure. In some embodiments, the pull-up unit circuit 700 may include a pull-up circuit 702 and a plurality of AND gate circuits 704. In some embodiments, the pull-up circuit 702 may include a resistor RW 706 and N-channel MOS transistors TNU0 to TNU6 coupled in parallel between a positive power supply potential VDDQ and the resistor RW 706. In another embodiments, the pull-up circuit 702 may include P-channel MOS transistors. A number of the N-channel or P-channel MOS transistors may be the same as a number of bits in any of the impedance code signals, ZQCODE_2 or ZQCODE_2'. While FIG. 7 shows seven bits, the number of bits may be determined based on the number of bits in the impedance code signals, and the number of bits may be or may not be seven. In some embodiments, the transistors TNU0 to TNU6 may have different sizes (strengths). Thus, the total impedance may be controlled finely or coarsely by activating a transistor with a small size or a transistor with a large size. In some embodiments, the drains of the transistors TNU0 to TNU6 may be coupled in common to a power supply line VL that provides the positive power supply potential VDDQ. The sources of the transistors TNU0 to TNU6 may be coupled to the data terminal DQ, such as one of the data terminals 124, via the resistors RW 706 and RAL 708. Bits DCODEPU0 to DZQCODE_PU6 of code control signal DZQCODE_PU may be provided to gate electrodes of the transistors TNU0 to TNU6. Accordingly, the transistors TNU0 to TNU6 may be selectively activated or deactivated responsive to the code control signal DCODEPU. As shown in FIG. 7, the code control signal DCODEPU is generated by logically combining each bit of a code signal ZQCODE_PU, such as ZQCODE_2 or ZQCODE_2', and an internal data bit DATA by using the AND gate circuit 704. When the internal data bit DATA is at a logic low level (e.g., "0"), all the bits DZQCODE_PU0 to DCODEPU6 of the code control signal DZQCODE_PU are at a logic low level regardless of the logic level of each bit of the code signal ZQCODE_PU. As a result, all the transistors TNU0 to TNU6 may be deactivated. When the internal data bit DATA is at a logic high level, a value of the code control signal DCODEPU is the same as a value of the code signal ZQCODE_PU. As a result, the transistors TNU0 to TNU6 may be selectively activated or deactivated based on the individual bit values of the code control signal DZQCODE_PU. Thus, the impedance of the pull-up unit circuit 700 and the data terminal DQ may be adjusted according to the value of the code signal ZQCODE_PU.

Figure 8:
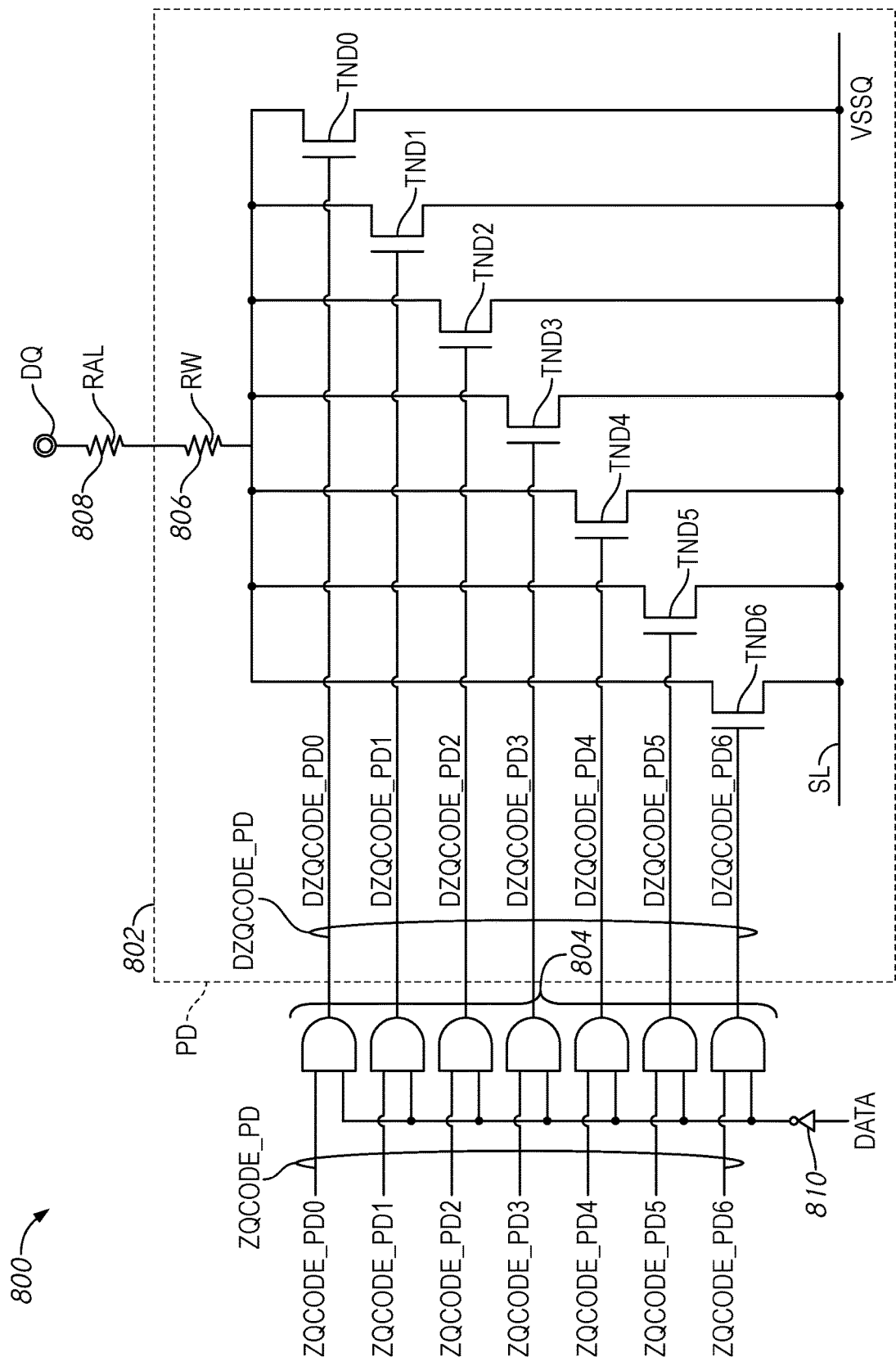
FIG. 8 is a schematic diagram of a pull-down unit circuit in accordance with an embodiment of the present disclosure.

FIG. 8 is a schematic diagram of a pull-down unit circuit in accordance with the present disclosure. In some embodiments, the pull-down unit circuit 800 may include a pull-down circuit 802 and a plurality of AND gate circuits 804. In some embodiments, the pull-down circuit 802 may include a resistor RW 806 and N-channel MOS transistors TND0 to TND6 coupled in parallel between a negative power supply potential VSSQ and the resistor RW 806. In another embodiments, the pull-down circuit 802 may include P-channel MOS transistors. A number of the N-channel or P-channel MOS transistors may be the same as a number of bits in any of the impedance code signals, ZQCODE_1 or ZQCODE_1'. While FIG. 8 shows seven bits, the number of bits may be determined based on the number of bits in the impedance code signals, and the number of bits may be or may not be seven. In some embodiments, the transistors TND0 to TND6 may have different sizes (strengths). Thus, the total impedance may be controlled finely or coarsely by activating a transistor with a small size or a transistor with a large size. In some embodiments, the sources of the transistors TND0 to TND6 may be coupled in common to a power supply line SL that provides the negative power supply potential VSSQ. The drains of the transistors TND0 to TND6 may be coupled to the data terminal DQ, such as one of the data terminals 124, via the resistors RW 806 and RAL 808. Bits DZQCODE_PD0 to DZQCODE_PD6 of code control signal DZQCODE_PD may be provided to gate electrodes of the transistors TND0 to TND6. Accordingly, the transistors TND0 to TND6 may be selectively activated or deactivated responsive to the code control signal DZQCODE_PD. As shown in FIG. 8, the code control signal DZQCODE_PD is generated by logically combining each bit of a code signal ZQCODE_PD, such as ZQCODE_1 or ZQCODE_1', and an inverted data bit after inversion of the internal data bit DATA by an inverter 810 further by using an AND gate circuit 804. When the internal data bit DATA is at a logic high level (e.g., "1"), the inverted internal data bit DATA is at a logic low level and all the bits DZQCODE_PD0 to DZQCODE_PD6 of the code control signal DZQCODE_PD are at a logic low level regardless of the logic level of each bit of the code signal ZQCODE_PD. As a result, all the transistors TND0 to TND6 may be deactivated. When the internal data bit DATA is at a logic low level, a value of the code control signal DZQCODE_PD is the same as a value of the code signal ZQCODE_PD. As a result, the transistors TND0 to TND6 may be selectively activated or deactivated based on the individual bit values of the code control signal DZQCODE_PD. Thus, the impedance of the pull-down unit circuit 800 and the data terminal DQ may be adjusted according to the value of the code signal ZQCODE_PD.

Those skilled in the art understand the paired configuration and operation of pull-up and pull-down unit circuits in the driver circuits 212 and thus, for brevity, the configuration and operation of the pull-up and pull-down units will not be further discussed. The driver circuits 214 and 216 may include similar on-die termination circuits as the pull-down unit circuit 800.

Figure 9:
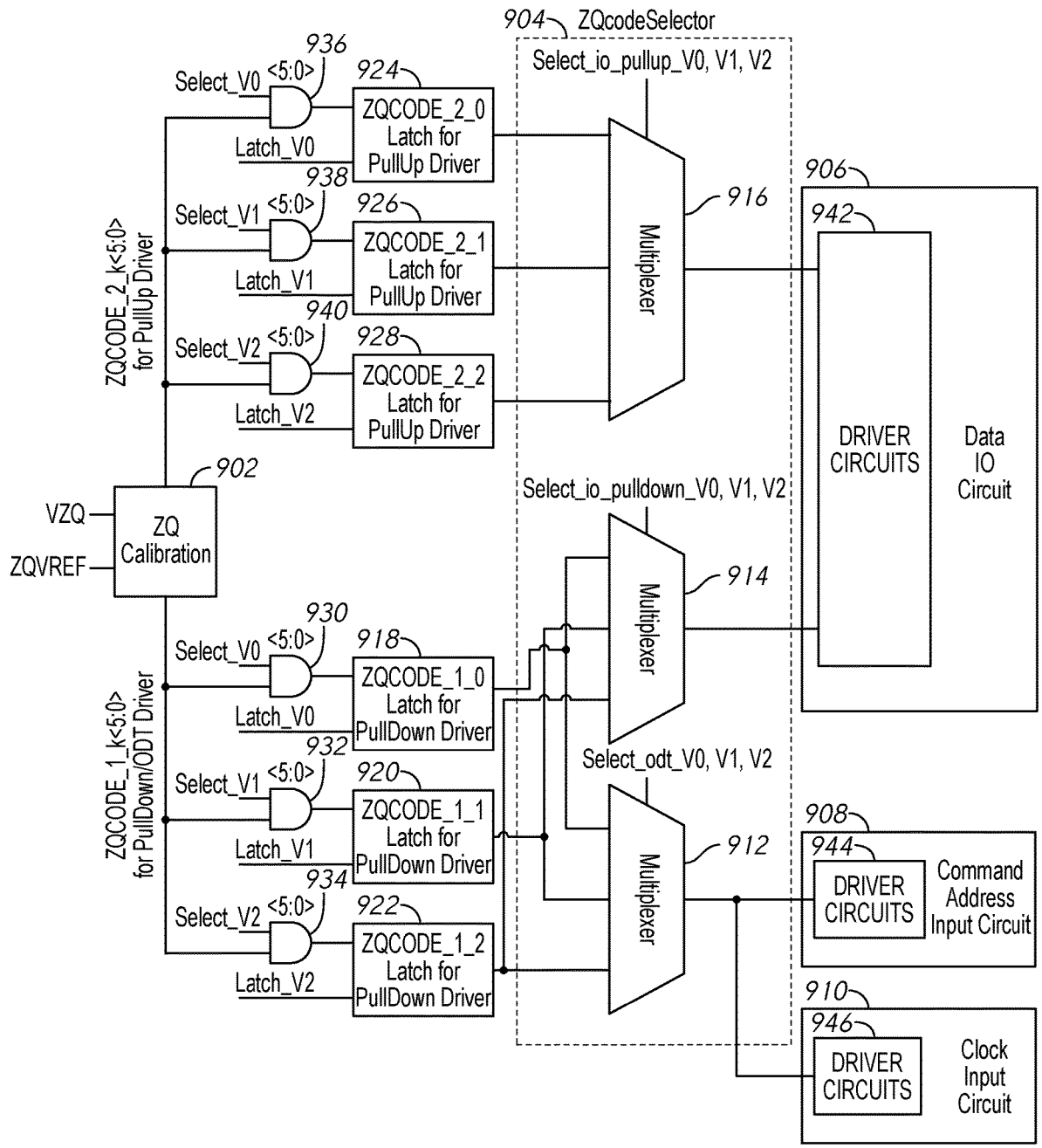
FIG. 9 is a schematic diagram of a ZQ calibration circuit, a ZQ code selector, a data input/output circuit, a command/address input circuit and a clock input circuit, in accordance with an embodiment of the present disclosure.

FIG. 9 is a schematic diagram of a ZQ calibration circuit 902, a ZQ code selector 904, a data input/output circuit 906, a command/address input circuit 908 and a clock input circuit 910, in accordance with the present disclosure. The ZQ calibration circuit 902 may be used to implement the ZQ calibration circuit 138 in some examples. The ZQ code selector 904 may be used to implement the ZQ code selector 140 in some examples. In some examples, the data input/output circuit 906 may implement the data input/output circuit 117. In some examples, the command/address input circuit 908 may implement the command/address input circuit 131. In some examples, the clock input circuit 910 may implement the clock input/output circuit 135.

The ZQ calibration circuit 902 may receive a ZQ pad voltage VZQ on a calibration terminal ZQ 127. For example, the ZQ calibration circuit 902 may compare the ZQ pad voltage VZQ with a reference potential ZQVREF provided by a power supply circuit, such as a ZQ power supply circuit 139'. Based on ZQ pad voltage VZQ and the reference potential ZQVREF, the ZQ calibration circuit 902 may control an impedance code signal ZQCODE_1_$k$ ($k$: a positive integer less than n) for a pull-down operation and/or an on-die termination and an impedance code signal ZQCODE_2_$k$ for a pull-up operation. In some embodiments, the impedance code signals ZQCODE_1_$k$ and ZQCODE_2_$k$ may include bits determined and updated during a calibration operation.

In some embodiments, the ZQ calibration circuit 902 may provide multiple codes that correspond to multiple power supply voltages. In some embodiments, the multiple power supply voltages may be configured according to devices. In an example of FIG. 9, a number n of the multiple power supply voltages is three. The ZQ calibration circuit 902 may provide the impedance code signals for a pull-down operation and/or an on-die termination ZQCODE_1_0, ZQCODE_1_1 and ZQCODE_1_2 that correspond to the voltages V0, V1 and V2 at times t0, t1 and t2 respectively. In some embodiments, the interval between the times t0, t1 and t2 may be constant. Logic AND gate circuits 930, 932 and 934 may be coupled to an output node of the ZQ calibration circuit 902. The logic AND gate circuits 930, 932 and 934 may receive the impedance code signals ZQCODE_1_0, ZQCODE_1_1 and ZQCODE_1_2 from the ZQ calibration circuit 902, respectively. The logic AND gate circuits 930, 932 and 934 may also receive selection signals Select_V0, Select_V1, and Select_V2, respectively. Responsive to the selection signals Select_V0, Select_V1, and Select_V2 in an active state, the logic AND gate circuits 930, 932 and 934 may provide the impedance code signals ZQCODE_1_0, ZQCODE_1_1 and ZQCODE_1_2. Latch circuits 918, 920 and 922 may receive the impedance code signals ZQCODE_1_0, ZQCODE_1_1 and ZQCODE_1_2, and store the impedance code signals ZQCODE_1_0, ZQCODE_1_1 and ZQCODE_1_2 responsive to latch signals Latch_V0, Latch_V1 and Latch_V2, respectively. In some embodiments, the latch signals Latch_V0, Latch_V1 and Latch_V2 may be issued internally responsive to an end of each calibration for pull-down operations and/or an-on-die terminations. Thus, the impedance code signals ZQCODE_1_0, ZQCODE_1_1 and ZQCODE_1_2 may be updated.

The ZQ code selector 904 may include selector circuits 912 and 914. In some embodiments, the selector circuits 912 and 914 may be multiplexers. The selector circuits 912 and 914 may receive the impedance code signals ZQCODE_1_0, ZQCODE_1_1 and ZQCODE_1_2. The selector circuit 912 may selectively provide one of the impedance code signals ZQCODE_1_0, ZQCODE_1_1 and ZQCODE_1_2 responsive to a selection signal Select_io_odt_V0, V1, V2 to driver circuits 944 and 946 in the command/address input circuit 908 and the clock input circuit 910, respectively. In some embodiments, the driver circuits 944 and 946 may include one or more pull-down unit circuits that may function as on-die terminators and the one of the impedance code signals ZQCODE_1_0, ZQCODE_1_1 and ZQCODE_1_2 may be provided to the one or more pull-down units. The selector circuit 914 may selectively provide one of the impedance code signals ZQCODE_1_0, ZQCODE_1_1 and ZQCODE_1_2 responsive to a selection signal Select_io_pulldown_V0, V1, V2 to driver circuits 942 for the pull-down operation in the data input/output circuit 906. In some embodiments, the driver circuits 942 may include one or more pull-down unit circuits and the one of the impedance code signals ZQCODE_1_0, ZQCODE_1_1 and ZQCODE_1_2 may be provided to the one or more pull-down unit circuits.

Similarly, the ZQ calibration circuit 902 may provide the impedance code signals for a pull-up operation ZQCODE_2_0, ZQCODE_2_1 and ZQCODE_2_2 that correspond to the voltages V0, V1 and V2 at times t0, t1 and t2 respectively. In some embodiments, the interval between the times t0, t1 and t2 may be constant. Logic AND gate circuits 936, 938 and 940 may be coupled to an output node of the ZQ calibration circuit 902. The logic AND gate circuits 936, 938 and 940 may receive the impedance code signals ZQCODE_2_0, ZQCODE_2_1 and ZQCODE_2_2 from the ZQ calibration circuit 902, respectively. The logic AND gate circuits 936, 938 and 940 may also receive the selection signals Select_V0, Select_V1, and Select_V2, respectively. Responsive to the selection signals Select_V0, Select_V1, and Select_V2 in an active state, the logic AND gate circuits 936, 938 and 940 may provide the impedance code signals ZQCODE_2_0, ZQCODE_2_1 and ZQCODE_2_2. Latch circuits 924, 926 and 928 may receive the impedance code signals ZQCODE_2_0, ZQCODE_2_1 and ZQCODE_2_2, and store the impedance code signals ZQCODE_2_0, ZQCODE_2_1 and ZQCODE_2_2 responsive to the latch signals Latch_V0, Latch_V1 and Latch_V2, respectively. In some embodiments, the latch signals Latch_V0, Latch_V1 and Latch_V2 may be issued internally responsive to an end of each calibration for pull-up operations. Thus, the impedance code signals ZQCODE_2_0, ZQCODE_2_1 and ZQCODE_2_2 may be updated.

The ZQ code selector 904 may include a selector circuit 916. In some embodiments, the selector circuit 916 may be a multiplexer. The selector circuit 916 may receive the impedance code signals ZQCODE_2_0, ZQCODE_2_1 and ZQCODE_2_2. Responsive to a selection signal Select_io_pullup_V0, V1, V2, the selector circuit 916 may selectively provide one of the impedance code signals ZQCODE_2_0, ZQCODE_2_1 and ZQCODE_2_2, to driver circuits 942 for the pull-up operation in the data input/output circuit 906. In some embodiments, the driver circuits 942 may include one or more pull-up unit circuits and the one of the impedance code signals ZQCODE_2_0, ZQCODE_2_1 and ZQCODE_2_2 may be provided to the one or more pull-up unit circuits.

Techniques to provide different impedance codes to pull-up driver circuits, pull-down driver circuits and on-die-termination driver circuits in input/output circuits responsive to multiple power supply voltages are disclosed. In some embodiments, an impedance (ZQ) code selector may provide pull-up and pull-down drivers of a data input/output circuit with either an impedance code based on impedance (ZQ) calibration or another impedance code according to different peripheral power supply voltages. In some embodiments, an impedance (ZQ) code selector may provide pull-up and pull-down drivers of a data input/output circuit and on-die termination drivers of a command/address input circuit and a clock input circuit with different impedance codes based on multiple impedance (ZQ) calibrations according to different peripheral power supply voltages.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:
    an impedance calibration circuit configured to provide a first impedance code;
    an impedance code selector configured to provide either the first impedance code or a second impedance code, wherein the impedance code selector is configured to provide the first impedance code or the second impedance code based on a first power supply mode or a second power supply mode, respectively; and
    a driver circuit configured to receive either the first impedance code or the second impedance code from the impedance code selector to set an impedance of the driver circuit.

2. The apparatus of claim 1, wherein the second impedance code is a code other than any code provided by the impedance calibration circuit.

3. The apparatus of claim 2, wherein the second impedance code comprises a plurality of predetermined bits.

4. The apparatus of claim 2, wherein the impedance code selector comprises a storage configured to store the second impedance code.

5. The apparatus of claim 1, wherein the first power supply mode corresponds to a first power supply voltage and the second supply mode corresponds to a second power supply voltage that is lower than the first power supply voltage.

6. The apparatus of claim 5, further comprising a memory cell array and a peripheral region outside the memory cell array,
    wherein the first and second power supply voltages are provided in the peripheral region.

7. The apparatus of claim 6, further comprising a data input/output circuit configured to receive and transmit data signals in the peripheral region,
    wherein the data input/output circuit comprises the driver circuit.

8. The apparatus of claim 7, further comprising a second driver circuit, wherein the driver circuit is a first driver circuit,
    wherein the impedance calibration circuit configured to provide a third impedance code,
    wherein the impedance code selector is further configured to provide either the third impedance code or a fourth impedance code, and
    wherein the second driver circuit is configured to receive either the third impedance code or the fourth impedance code from the impedance code selector.

9. The apparatus of claim 8, wherein the first driver circuit is a pull-down driver circuit and the second driver circuit is a pull-up driver circuit.

10. The apparatus of claim 7, further comprising a command and address input circuit in the peripheral region and configured to receive command and address signals,
    wherein the command and address input circuit comprises an on-die termination driver circuit that is configured to receive the first impedance code.

11. The apparatus of claim 8, further comprising a clock input circuit in the peripheral region,
    wherein the clock input circuit comprises an on-die termination driver circuit that is configured to receive the first impedance code.

12. An apparatus comprising:
an impedance calibration circuit configured to provide a first impedance code at a first time and further configured to provide a second impedance code at a second time;
an impedance code selector configured to provide either the first impedance code or the second impedance code, wherein the impedance code selector is configured to provide the first impedance code or the second impedance code responsive to a first power supply mode signal or a second power supply mode signal, respectively; and
a driver circuit configured to receive either the first impedance code or the second impedance code from the impedance code selector.

13. The apparatus of claim 11, wherein the impedance calibration circuit is further configured to provide a third impedance code at a third time,
wherein the impedance code selector is configured to provide either the first impedance code, the second impedance code, or the third impedance code, and
wherein the driver circuit configured to receive either the first impedance code, the second impedance code or the third impedance code from the impedance code selector.

14. The apparatus of claim 13, wherein the impedance code selector is configured to provide the first impedance code, the second impedance code or the third impedance code responsive to a first power supply mode signal, a second power supply mode signal, or a third power supply mode signal, respectively.

15. An apparatus comprising:
an impedance calibration circuit configured to provide a first impedance code;
an impedance code selector comprising:
a selector circuit configured to provide either the first impedance code or a second impedance code responsive to a power supply mode; and
a driver circuit configured to receive either the first impedance code or the second impedance code from the impedance code selector.

16. The apparatus of claim 15, wherein the impedance code selector further comprises a storage,
wherein the selector circuit is configured to receive the second impedance code from the storage.

17. The apparatus of claim 15, further comprising:
a first latch coupled to the selector circuit, the first latch configured to store the first impedance code responsive to a first latch signal; and
a second latch coupled to the selector circuit, the second latch configured to store the second impedance code responsive to a second latch signal,
wherein the first and second latch signals are issued responsive to an end of calibration.

18. The apparatus of claim 17, further comprising:
a first logic gate circuit configured to receive the first impedance code and a first selection signal, and further configured to provide the first latch with the first impedance code responsive to the first selection signal; and
a second logic gate circuit configured to receive the second impedance code and a second selection signal, and further configured to provide the second latch with the second impedance code responsive to the second selection signal.

* * * * *